US012660233B2

(12) United States Patent
Tegen et al.

(10) Patent No.: US 12,660,233 B2
(45) Date of Patent: Jun. 16, 2026

(54) POWER TRANSISTOR DEVICE HAVING AN INTERFACIAL SILICON NITRIDE LAYER BETWEEN A FIELD PLATE AND A SUBSTRATE REGION AND METHOD OF FABRICATING THE SAME

(71) Applicant: Infineon Technologies Austria AG, Villach (AT)

(72) Inventors: Stefan Tegen, Dresden (DE); Timothy Henson, Mount Shasta, CA (US)

(73) Assignee: Infineon Technologies Austria AG, Villach (AT)

( * ) Notice: Subject to any disclaimer, the term of this patent is extended or adjusted under 35 U.S.C. 154(b) by 544 days.

(21) Appl. No.: 18/135,788

(22) Filed: Apr. 18, 2023

(65) Prior Publication Data

US 2023/0352582 A1 Nov. 2, 2023

(30) Foreign Application Priority Data

Apr. 28, 2022 (EP) .................................... 22170661

(51) Int. Cl.
| | |
|---|---|
| *H10D 30/60* | (2025.01) |
| *H10D 30/01* | (2025.01) |
| *H10D 30/62* | (2025.01) |
| *H10D 30/66* | (2025.01) |
| *H10D 64/00* | (2025.01) |
| *H10D 64/01* | (2025.01) |
| *H10D 64/68* | (2025.01) |

(52) U.S. Cl.
CPC ....... *H10D 30/601* (2025.01); *H10D 30/0212* (2025.01); *H10D 30/024* (2025.01); *H10D 30/0297* (2025.01); *H10D 30/6211* (2025.01); *H10D 30/665* (2025.01); *H10D 30/668* (2025.01); *H10D 64/021* (2025.01); *H10D 64/112* (2025.01); *H10D 64/117* (2025.01); *H10D 64/693* (2025.01)

(58) Field of Classification Search
CPC ... H10D 30/668; H10D 30/0291–0297; H10D 30/66–669; H10D 64/111–117
See application file for complete search history.

(56) References Cited

U.S. PATENT DOCUMENTS

| | | | |
|---|---|---|---|
| 4,876,220 | A | 10/1989 | Mohsen et al. |
| 7,723,782 | B2 | 5/2010 | Hirler |
| 9,385,228 | B2 | 7/2016 | Laven et al. |
| 9,761,676 | B2 | 9/2017 | Jenson |
| 2006/0214221 | A1 | 9/2006 | Challa et al. |
| 2015/0084121 | A1* | 3/2015 | Siemieniec .......... H10D 64/252 |
| | | | 438/270 |

(Continued)

FOREIGN PATENT DOCUMENTS

| | | |
|---|---|---|
| DE | 102013213007 A1 | 1/2015 |
| WO | 2009026174 A1 | 2/2009 |

*Primary Examiner* — Younes Boulghassoul
(74) *Attorney, Agent, or Firm* — Murphy, Bilak & Homiller, PLLC

(57) ABSTRACT

In an embodiment, a power transistor device includes a substrate formed of crystalline silicon and having a first surface and a second surface opposing the first surface. A field plate formed of polysilicon is electrically connected with the substrate. An interfacial silicon nitride layer is arranged between the polysilicon of the field plate and the crystalline silicon of the substrate.

20 Claims, 12 Drawing Sheets

(56) References Cited

U.S. PATENT DOCUMENTS

| | | | |
|---|---|---|---|
| 2015/0279946 A1* | 10/2015 | Henson | H10D 30/668 |
| | | | 438/270 |
| 2015/0318347 A1* | 11/2015 | Falck | H10D 30/60 |
| | | | 257/494 |
| 2016/0079238 A1* | 3/2016 | Siemieniec | H10D 12/481 |
| | | | 257/140 |
| 2016/0260809 A1* | 9/2016 | Hirler | H01L 21/3083 |
| 2018/0240867 A1* | 8/2018 | Nitta | H10D 62/127 |
| 2019/0296115 A1* | 9/2019 | Chen | H10D 30/668 |
| 2020/0212219 A1 | 7/2020 | Kim et al. | |
| 2021/0305363 A1 | 9/2021 | Nakagawa et al. | |
| 2022/0069088 A1 | 3/2022 | Nakano et al. | |
| 2023/0078116 A1* | 3/2023 | Kobayashi | H10D 30/668 |
| | | | 257/331 |
| 2023/0087151 A1* | 3/2023 | Grebs | H10D 64/518 |
| | | | 257/77 |
| 2024/0421199 A1* | 12/2024 | Nagata | H10D 30/60 |

* cited by examiner

POWER TRANSISTOR DEVICE HAVING AN INTERFACIAL SILICON NITRIDE LAYER BETWEEN A FIELD PLATE AND A SUBSTRATE REGION AND METHOD OF FABRICATING THE SAME

BACKGROUND

Common power transistor devices for power applications include Si CoolMOS®, Si Power MOSFETs, (metal oxide semiconductor field effect transistors) and Si Insulated Gate Bipolar Transistors (IGBTs). Silicon-based power MOSFET devices, include a p-n junction between a drift region and a body region. On-state resistance (RDSon) and breakdown voltage are two important parameters in a power MOSFET. The on-state resistance of a power MOSFET is the drain-to-source resistance of the power MOSFET in an on-state and depends partially on the doping level of the drift region. The breakdown voltage of a power MOSFET is the voltage at which a reverse biased body-drift p-n junction breaks down and significant current starts to flow between the source and the drain by an avalanche multiplication process.

It is desirable for a power transistor device to have a reduced RDSon in its on-state and be able to withstand a high drain-to-source voltage during its off-state (i.e., a high reverse voltage blocking capability). However, there is a trade-off in the design of a power semiconductor device between its reverse voltage blocking capability and its on-state resistance. One technique for improving the reverse voltage blocking capability of a power MOSFET involves placing field plates in trenches in the drift region. The field plates are electrically connected to a fixed electrical potential, such as gate or source potential in order to allow a depletion region to expand in the drift region.

Further improvements to power MOSFET devices are, however, desirable.

SUMMARY

According to an embodiment, a power transistor device is provided which comprises a substrate formed of crystalline silicon. The substrate has a first surface and a second surface opposing the first surface. The power transistor device comprises a field plate formed of polysilicon that is electrically connected with the substrate and an interfacial silicon nitride layer that is arranged between the polysilicon of the field plate and the crystalline silicon of the substrate.

The silicon nitride layer is, therefore, arranged at the interface between the polysilicon material of the field plate and the crystalline silicon material of the substrate.

Polysilicon or polycrystalline silicon has a polycrystalline grain structure and includes a plurality of grains or crystallites of differing orientations. The substrate is formed of crystalline silicon and may be formed of monocrystalline silicon, such as a single crystal, or may be formed of an epitaxial crystalline silicon layer that has a single crystallographic orientation and that is formed by the epitaxial growth of the layer, for example on a single crystal substrate.

In some embodiments, the interfacial silicon nitride layer forms part of the electrical connection between the field plate and the substrate.

In some embodiments, the interfacial silicon nitride layer is in direct contact with the polysilicon of the field plate on a first side and is in direct contact with the crystalline silicon of the substrate on an opposing second side.

In some embodiments, the polysilicon and the crystalline silicon have the same doping type, for example n-type, but differing doping levels. For example, the polysilicon may have a doping level that is at least twice the doping level of the crystalline silicon.

In some embodiments, the polysilicon and the crystalline silicon have opposing doping types, for example the polysilicon is n-type and the crystalline silicon p-type or vice versa. In these embodiments, the doping level may also differ. For example, the polysilicon may be p-type and have a doping level that is at least twice the doping level of the crystalline silicon that is n-type.

In some embodiments, the field plate is arranged in a trench which extends into the substrate from the first surface.

The contact and electrical connection between the polycrystalline field plate and the crystalline silicon substrate is arranged below the first surface of the substrate as the field plate is arranged in the trench. The contact may be referred to as a buried contact. The contact may be formed between the sidewall of the trench formed by the crystalline silicon of the substrate and the field plate formed of polysilicon positioned within the trench. The interfacial silicon nitride layer may be arranged on the sidewall of the trench and the field plate arranged on the silicon nitride layer on the sidewall of the trench.

The power transistor device may be a lateral device or a vertical device.

The vertical power transistor device has a drift path that extends substantially perpendicular to the first surface of the crystalline silicon substrate.

The transistor device may be a power device that comprises a charge compensation structure provided by a plurality of field plates and that is configured to switch a load current. The transistor device typically comprises an active area with a plurality of active transistor cells, each including a field plate and a gate electrode. The active area is typically surrounded by an edge termination area.

In some embodiments, the transistor device comprises an active area comprising a drift region, a source region, a body region and a drain region. The semiconductor substrate has a first conductivity type and forms the drift region. The body region has a second conductivity type which opposes the first conductivity type and is arranged on the drift region. The source region has the first conductivity type and is arranged on the body region and extends to the first surface of the substrate. The drain region has first conductivity type. For a vertical transistor device, the drain region is arranged at the second surface of the substrate. The field plate is arranged in a trench which extends into the substrate from the first surface.

The source region and drain region are typically highly doped with the first conductivity type and the drift region is lightly doped with the first conductivity type.

The polysilicon of the field plate is electrically conductive and, in some embodiments, the polysilicon has the first conductivity type. The doping level of the polysilicon may be at least twice the doping level of the drift region. Since the silicon nitride layer is arranged between the polysilicon and the crystalline silicon, the interfacial silicon nitride layer is configured as a diffusion barrier to hinder the diffusion of the dopants of the first conductivity type from the higher doped polysilicon of the field plate into the lower doped crystalline silicon of the substrate.

In some embodiments, the interfacial silicon nitride layer has a thickness of 0.2 nm to 10.0 nm, or 0.2 nm to 5 nm, or 0.2 nm to 2 nm, or 0.4 nm to 1.8 nm.

In some embodiments, in which the field plate is arranged in a trench that extends into the substrate formed of crystalline silicon from the first surface, the trench has sidewalls and a base and comprises electrically insulating material. The silicon nitride layer is arranged on the sidewall of the trench that is formed from the crystalline silicon of the substrate. In some embodiments, the silicon nitride layer may line the sidewalls and base of the trench. In some embodiments, the silicon nitride layer is arranged on only the sidewalls of the trench. In some embodiments, the silicon nitride layer is arranged only on a portion of the sidewall of the trench, for example an upper portion of the sidewall of the trench. The remainder of the volume of the trench that is positioned between the field plate and the sidewalls and base of the trench or between the field plate and the silicon nitride layer on the sidewalls of the trench is filled with electrically insulating material.

In some embodiments, the trench is a columnar trench. In other embodiments, the trench is an elongate trench.

A columnar trench is a trench formed in the substrate which has a small or narrow circumference or width in proportion to its height/depth in the substrate. An elongate trench describes a stripe-shaped trench which is longer than it is deep, in other words its long direction in the plane of the first surface of the substrate is greater the its depth perpendicular to the first surface.

In some embodiments, the field plate has a least one lateral extension formed of polysilicon that extends through a portion of the electrically insulating layer that is arranged on the sidewall of the trench such that the lateral extension is in contact with the silicon nitride layer arranged on the sidewall of the trench. The silicon nitride layer forms an interfacial layer arranged between the lateral extension of the polysilicon field plate and the sidewall of the trench formed in the crystalline silicon substrate. An electrical connection between the field plate and the substrate is formed that comprises a multilayer structure of the polysilicon of the end face of the lateral extension, the silicon nitride layer and the crystalline silicon of the substrate that forms the sidewall of the trench.

In some embodiments, the lateral extension extends from the top of the field plate.

In some embodiments, the trench and the field plate have an elongate stripe-like structure with a longest length extending parallel to the first surface and the lateral extension extends perpendicularly form the longest length of the field plate. In some embodiments, the trench and the field plate have a columnar or needle-shape having a longest length that expends perpendicular to the first surface and the lateral extension extends perpendicularly to the longest length and parallel to the first surface.

In some embodiments, the field plate includes two lateral extensions that extend in opposing directions such that the field plate has a T-shape in cross-section.

In some embodiments, the interfacial silicon nitride layer is arranged between the lateral extension of the field plate and the drift region. In these embodiments, the lateral extension is placed at a depth from the first surface that is aligned with the drift region. In these embodiments, the portion of the sidewall, on which the silicon nitride layer is arranged and which is aligned with the lateral extension of the field plate, forms the drift region of the power transistor device. The field plate is electrically connected to the potential of the drift region.

The only electrical connection between the field plate and the substrate is that formed by the end face of the lateral extension/silicon nitride/sidewall structure. The remainder of the field plate is spaced apart from the substrate by electrically insulating material.

In some embodiments, the trench further comprises a gate electrode that is arranged in the trench above the field plate. The gate electrode is electrically insulated from the field plate, for example by an intermediate electrically insulating layer arranged in the trench between the field plate and the gate electrode.

In some embodiments, the power transistor device further comprises a further field plate that is arranged in the trench. The further field plate is arranged above field plate and is electrically insulated from the field plate, for example by an intermediate electrically insulating layer arranged in the trench between the field plate and the further field plate.

In some embodiments, at least two field plates and a gate electrode are arranged in a stack in the trench with the gate electrode at the top. The gate electrode is electrically insulated from the further field plate by an intervening first intermediate electrically insulating layer and the further field plate is electrically insulated from the field plate by an intervening second intermediate electrically insulating layer.

In some embodiments, the interfacial silicon nitride layer is arranged between the lateral extension of the field plate and the body region of the transistor device. In this embodiment, the lateral extension of the field plate is positioned within the trench at a position, i.e. depth from the first surface, which is aligned with the body region. The body region forms a portion of the sidewall of the trench. The field plate is electrically connected to the body region and, therefore, to source potential.

The only electrical connection between the field plate and the substrate is that formed by the end face of the lateral extension/silicon nitride/sidewall structure. The remainder of the field plate is spaced apart from the substrate by electrically insulating material.

According to an embodiment, a method of fabricating a power transistor device, in particular a vertical power transistor device with a field plate in a trench, is provided. The method comprises forming a trench in a first surface of the substrate formed of crystalline silicon. The trench has a base and sidewalls. The trench is lined with a first electrically insulating layer and then filled with polysilicon. The polysilicon is removed from an upper portion of the trench and a field plate is formed from the remainder of the polysilicon having an upper portion that is exposed from the first insulating layer. The first insulating layer is then removed from the sidewalls, exposing the sidewalls and crystalline material forming the sidewalls and from the upper portion of the trench while leaving the first insulating layer in the lower portion of the trench. A silicon nitride layer is formed on the exposed sidewalls of the trench and on the upper portion of the field plate which is exposed from the first insulating layer. A first polysilicon layer is formed on the silicon nitride layer and a lateral extension of the field plate is formed that extends from the field plate to the silicon nitride on the sidewall. The lateral extension of the field plate extends towards the sidewall of the trench from the field plate that is arranged in the centre of the trench. The silicon nitride forms an interfacial layer between the lateral extension and the sidewall of the trench formed of crystalline silicon.

The lateral extension therefore extends to and is in direct contact with the silicon nitride layer arranged on the sidewall of the trench and the polysilicon of the field plate arranged at the centre of the trench. The silicon nitride layer is, therefore, arranged between and forms an interfacial layer between the polysilicon of the lateral extension of field plate and the crystalline silicon of the substrate which forms the sidewall of the trench.

The field plate and the lateral extension or extensions may be formed from two sublayers of polysilicon, or in some embodiments the lateral extension or extensions are formed from two sublayers of polysilicon.

In some embodiments, the removing the first insulating layer may be performed using the following method. An outer portion of the first insulating layer is removed from the upper portion of the trench to form a thinned first insulating layer on the sidewalls of the trench in the upper portion of the trench as well as to expose the upper region of the field plate from the first insulating layer arranged in the lower portion of the trench. A first polysilicon sublayer is formed on the exposed region of the field plate such that the first polysilicon sublayer extends towards and may be in contact with the thinned insulating layer on the sidewall of the trench. The thinned first insulating layer is then removed from the sidewalls in the upper portion of the trench to expose the sidewalls. An upper portion of the first insulating layer is removed from between the first polysilicon sublayer and the sidewalls of the trench and an indentation is formed in an upper surface of the first insulating layer. The silicon nitride layer is then formed on the exposed sidewalls of the trench and on the first polysilicon sublayer. The silicon nitride layer may line the surface of the indentation. The indentation is then filled with a second polysilicon sublayer to form the lateral extension of the field plate from the first and second polysilicon sublayers, whereby the lateral extension extends from the field plate in the centre of the trench to the silicon nitride positioned directly on the side wall of the trench.

The first polysilicon sublayer may be deposited on the upper surface of the field plate and may increase the height of the field plate.

The indentation formed in the first insulating layer may extend from the field plate to the sidewalls of the trench, in other words, the electrically insulating layer is completely removed from a portion of the side face of the field plate that is arranged at the top of the remaining portion of the first insulating layer and is also completely removed from a portion of the sidewall of the trench that is arranged at the top of the remaining portion of the first insulating layer. This enables the indentation, when it is filled with polysilicon, to fill the region between the field plate and the sidewall of the trench and thus form lateral extension of the field plate.

In some embodiments, the depth of the lateral extension from the first surface is such that the lateral extension is aligned with the drift region of the power MOSFET so that the field plate is electrically coupled to the potential of the drift region.

In some embodiments, the depth of the lateral extension from the first surface is such that the lateral extension is aligned with the body region of the power MOSFET so that the field plate is electrically coupled to the potential of the body region.

In some embodiments, the method further comprises forming a second insulating layer on the sidewalls of the trench in the upper portion of the trench and on the field plate and on the lateral extension. The second insulating layer surrounds a gap formed in the upper portion of the trench. Conductive material is inserted into the gap to form a gate electrode or a further field plate in the upper portion of the trench. The conductive material may be polysilicon.

In some embodiments, the method continues by forming the body region of a second conductivity type that opposes the first conductivity type of the crystalline silicon substrate at substrate, forming a source region of the first conductivity type on the body region. The drain region comprises the first conductivity type and is arranged at the second surface of the substrate that opposes the first surface.

The body region and source region may be formed by implanting dopants of the second conductivity type and first conductivity type, respectively into the first surface of the crystalline substrate.

According to an embodiment, a diode is provided that comprises a polysilicon layer having a first conductivity type, a crystalline silicon layer having a second conductivity type opposing the first conductivity type and an interfacial silicon nitride layer that is arranged between the polysilicon layer and the crystalline silicon layer.

For example, the first conductivity type may be p-type and the second conductivity type is n-type or vice versa. The polysilicon layer may have a higher doping level that the crystalline silicon layer, for example at least twice as great.

The interfacial silicon nitride layer may act as a diffusion barrier so as to assist in the fabrication of a steep or sharp pn junction.

In some embodiments, the interfacial silicon nitride layer has a thickness that lies in the range of 0.2 nm to 10.0 nm, or 0.2 nm to 5 nm, or 0.2 nm to 2 nm, or 0.2 to 1.4 nm and in one particular example has a thickness of 0.7 nm.

In some embodiments, the interfacial silicon nitride layer is in direct contact with the polysilicon layer and the crystalline silicon layer.

In some embodiments, the crystalline layer is formed from a crystalline silicon substrate having a first surface and the polysilicon layer is arranged parallel to the first surface of the crystalline silicon substrate. For example, a layer of polysilicon may be deposited on the first surface of the crystalline silicon substrate. The pn junction of the diode extend substantially parallel with the first surface and may be referred to as a lateral diode.

In some embodiments, the crystalline layer is formed from a crystalline silicon substrate having a first surface and the polysilicon layer is arranged in a trench that extends into the crystalline layer form the first surface. The trench has sidewalls and a base, with the side walls extending substantially perpendicular to the first surface or at an inclined angle to the first surface.

In some embodiments, the interfacial silicon nitride layer is arranged on at least one of two opposing sidewalls of the trench and the polysilicon layer is arranged on the silicon nitride layer on the side wall of the trench. This embodiment provides two diodes.

In some embodiments, the interfacial silicon nitride layer is arranged on two opposing sides of the polysilicon layer and on opposing sidewalls of the trench that are formed from the crystalline silicon. In some embodiments, a silicon nitride layer is arranged on the two opposing sidewalls of the trench and the polysilicon fills the trench and is in contact with the two silicon nitride layers arranged on the opposing sidewalls of the trench.

In embodiments in which the sidewalls of the trench extend substantially perpendicularly to the first surface, the pn junction of the diode extends substantially perpendicularly to the first surface. The diode may be referred to as a vertical diode.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

Figure 1:
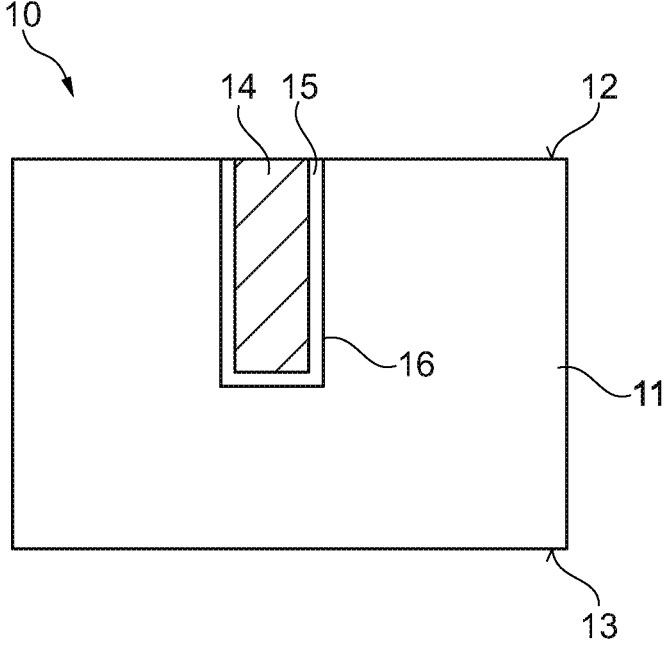
FIG. 1 illustrates a schematic view of a portion of a semiconductor device.

In the following detailed description, reference is made to the accompanying drawings, which form a part hereof, and in which is shown by way of illustration specific embodiments. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, thereof, is not to be taken in a limiting sense, and the scope of the present disclosure is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, various device types and/or doped semiconductor regions may be identified as being of n type or p type, but this is merely for convenience of description and not intended to be limiting, and such identification may be replaced by the more general description of being of a "first conductivity type" or a "second, opposite conductivity type" where the first type may be either n or p type and the second type then is either p or n type.

The figures illustrate relative doping concentrations by indicating "−" or "+" next to the doping type "n" or "p". For example, "n⁻" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations.

In some integration designs for semiconductor devices, contacts between polycrystalline silicon ("Poly Si") and crystalline silicon ("cSi") are formed and in some designs, these contacts are formed deep below the wafer surface. Growth of Poly Si on cSi could lead to crystal defects in the substrate, and, in the case of highly doped polysilicon, to an unwanted outdiffusion of the dopants into the cSi. These effects can result in a poorer electrical contact. In other integration designs, a buried, steep pn junction is needed, for example to form a pn diode. Here, one of the n-doped or p-doped materials or both can be Poly Si and the other can be cSi. These pn junctions formed between the materials have to remain steep, even if succeeding processes require high temperatures. Thus, preventing or reducing outdiffusion benefits the production of this steep pn junction.

According to an embodiment, a thin SiN layer is formed between the cSi and the Poly silicon, also in buried contacts, that prevents formation of crystal defects in cSi and outdiffusion of dopants, typically from a higher doped Poly Si to a lower doped cSi. The contact may be formed by growing a very thin SiN layer on the cSi where the contact to the Poly Si will be formed. This is done before the Poly Si is deposited and then the Poly Si is deposited onto the thin SiN layer.

The thickness of SiN layer is in the nanometer range or less, for example 0.2 nm to 10 nm, or 0.2 nm to 5 nm, or 0.2 nm to 2 nm, or 0.2 nm to 1.4 nm and in one particular example 0.7 nm.

The advantages of this thin SiN layer include preventing or hindering dopant outdiffusion from a highly doped Poly Si into the cSi, preventing or hindering the formation of crystal defects within the cSi during the Poly Si deposition and subsequent anneals. Additionally, the SiN layer is so thin that it does not lead to a significant contact resistance. The SiN layer is not removed, but remains within the structure. This is possible because it is so thin that its resistance can be neglected.

The SiN layer may be grown in a furnace within an atmosphere containing nitrogen. The thickness of the SiN layer can be well controlled by adjusting the process temperature. Process time and pressure play a more minor role in controlling the thickness of the SiN layer but may be adjusted.

The PolySi/SiN/cSi structure may be used to form buried contacts, that is a contact between a polysilicon element and a crystalline element of a device that is positioned within the volume of the substrate below the outer surfaces of the substrate rather than on an outer surface of the substrate.

One possible implementation of the PolySi/SiN/cSi structure is in stacked field plate FET (Field Effect Transistor) devices which includes two or more field plates formed of Poly Si and arranged in a stack in a trench formed in a crystalline silicon substrate. In these devices the silicon nitride interfacial layer can be used to connect the lower field plate directly to the mesa of the FET. The mesa serves as a voltage divider and puts the lower field plate to half of the BVDSS. This design may be used for slowly switching or quasi-static devices, like an or-ing switch for redundant power supplies or a battery protection switch, for achieving a low RON or if a low process complexity/low process costs are desired for the device.

Another possible implementation is in a transistor device a single field plate arranged in a trench. In one example, the trench and the field plate have an elongate a stripe form and the device has the stripe field plate directly connected to the drift region at a position below the gate electrode. This may simplify the process since a separate connection to the field plate is not required. It may also reduce the oxide thickness of the field oxide (FOX) and thus the device cell pitch, since the field plate potential will be at some voltage that is greater than 0 and thus less potential difference to drain. In a second example, the trench and the field plate are columnar or needle shaped and the needle-shaped field plate is contacted to the p+ body region, or the drift region at or below the surface of the silicon. This may simplify the contact fabrication process since the field plate will be directly connected and the contact fabrication process can focus on the p+/n+ contact for the MOSFET. In a third example, a needle-shaped field plate in a needle-shaped trench is connected to the drift region while a gate is integrated above the field plate. This may allow the smallest cell pitch for devices with columnar or needle-shaped trenches and field plates.

In some embodiments, the steep doping gradient achievable between the polysilicon and crystalline silicon of opposing doping types by way of the interfacial silicon nitride layer is used, for example for diode structures. The thin SiN layer prevents outdiffusion from the Poly Si into the crystalline substrate. Therefore, it can be used to build steep doping gradients. One implementation would be to deposit highly p-doped Poly Si on a lightly n-doped substrate, whereby the silicon nitride layer is first deposited on the lightly n-doped substrate and the highly p-doped Poly Si is deposited on the silicon nitride layer. This leads to a pn diode with a very steep pn gradient. The diode can be placed horizontally on the wafer surface or vertically within a trench structure.

FIG. 1 illustrates a schematic view of a portion of a semiconductor device 10 which includes a substrate 11. The substrate 11 is formed of crystalline silicon and has a first surface 12 and a second surface 13 opposing the first surface 12. The semiconductor device 10 further comprises a region 14 formed of polysilicon that is electrically connected with the substrate 11. An interfacial silicon nitride layer 15 is arranged between the polysilicon of the region 14 and the crystalline silicon of the substrate 11. The interfacial silicon nitride layer 15 forms part of the electrical connection between the region 14 and the substrate 11 and is in direct contact with both the region 14 and the crystalline silicon substrate 11. The interfacial silicon layer 15 has a thickness which may lie in the range of 0.2 nm to 10 nm.

The semiconductor device 10 may be a lateral power transistor device or a vertical power transistor device for switching a load current such as a Field Effect Transistor (FET), e.g. a MOSFET. In some embodiments, the region 14 is arranged on the first surface 12 of the substrate 11. In some embodiments, the region 14 is arranged in a trench 16 which is formed in the substrate 11. The region 14 formed of polysilicon may be used as a field plate in a lateral or vertical transistor device.

Figure 2:
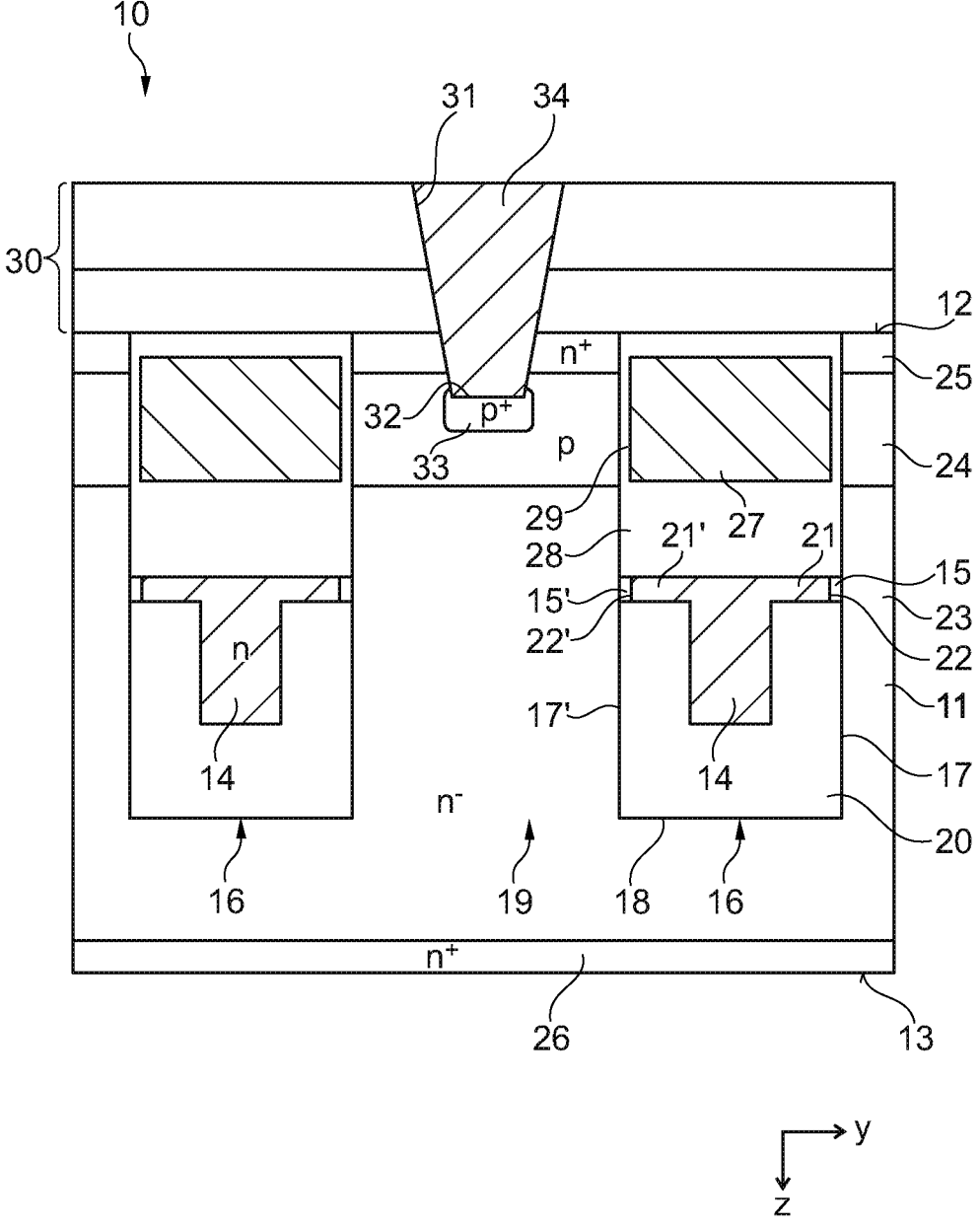
FIG. 2 illustrates a cross-sectional view of a vertical power transistor device according to an embodiment.

FIG. 2 illustrates a cross-sectional view of a semiconductor device 10 according to an embodiment. The semiconductor device 10 of FIG. 2 is a vertical power transistor device 10. The vertical power transistor device 10 comprises a substrate 11 formed of crystalline silicon which has a first surface 12, which is the front surface of the device, and a second surface 13, which opposes the first surface 12. The semiconductor device 10 of FIG. 2 is a vertical power transistor device 10 which has a drift path expending perpendicularly to the first surface 12. The vertical power transistor device 10 includes a charge compensation structure in the form of the field plate 14 which is formed of polysilicon and which is electrically connected with the substrate 11. An interfacial silicon nitride layer 15 is arranged between the polysilicon of the field plate 14 and the crystalline silicon of the substrate 11.

In this embodiment, the field plate 14 is arranged in a trench 16 which extends into the substrate 11 from the front first surface 12. The vertical power transistor device 10 comprises an active area comprising a plurality of active transistor cells, each including a trench 16 with a field plate. The vertical power transistor device 10 is suitable for switching a load current.

In this embodiment, the trenches 16 have an elongate striped like structure with the length, i.e. longest length, of the trench 16 extending into the plane of the drawing substantially parallel to one another. The trench 16 has sidewalls 17 and the base 18. Neighbouring ones of the trenches 16 are spaced apart by a mesa 19 which also has an elongate stripe-like structure and extend between the sidewalls 17 of neighbouring ones of the trenches 16. The individual trenches 16 are lined with insulating material 20 which covers the sidewalls 17 and the base 18 leaving a gap at the centre in which the polysilicon field plate 14 is formed. The thickness of the insulating material 20 on the base 18 of the trench 16 may be greater than the thickness on the sidewalls 17.

The field plate 14 also has an elongate stripe-like structure with its longest direction extending into the plane of the drawing, in the x direction using the Cartesian coordinate system, a height extending perpendicular to the first surface 12 in the z direction and a width extending perpendicularly to its length and parallel to the first surface 12 in the y direction. The field plate 14 is arranged towards the bottom of the trench 16. The field plate 14 includes at least one lateral extension 21 which is formed from polysilicon and which extends through the insulating material 20 to the sidewall 17. The lateral extension 21 extends from the field plate in the y direction.

The interfacial silicon nitride layer 15 is arranged on at least a portion of the sidewall 17 of the trench 16 and is arranged between the distal end face 22 of the lateral extension 21 and the crystalline silicon of the substrate 11. The interfacial silicon nitride layer 15 is in direct contact with the polysilicon of the distal end face 22 of the lateral extension 21 of the field plate 14 and with the crystalline silicon of the substrate 11 that forms the sidewall 17 of the trench 16 in order that the field plate 14 can be electrically connected to the substrate 11. In this portion of the trench 16, the insulating material 20 is not positioned on the sidewall 17 of the trench 16 and includes a though opening in which the lateral extension 21 is positioned.

The lateral extension 21 extends in a direction substantially parallel to the first surface 12 and perpendicular to the long length of the field plate 14 and increases the width of the of the field plate 14 in the y direction. The lateral extension 21 may protrude from the side face of the field plate 14 along the entire length of the field plate 14 and extend in the x-y plane. The lateral extension 21 itself has a height in the z direction that is less than the height in the direction of the field plate 14 positioned at the centre of the trench 16. The lateral extension 21 may extend laterally from the upper side of the field plate 14.

In the embodiment illustrated in FIG. 2, the field plate 14 includes two lateral extensions 21, 21' which extend in opposing directions. A second interfacial silicon nitride layer 15' is arranged between the second lateral extension 21' and the opposing sidewall 17' of the trench 16. The lateral extensions 21, 21' may extend from the upper side of the field plate 14 such that in the cross-sectional view, the field plate 14 has a T-shape.

The vertical power transistor device 10 comprises a drift region 23 that is formed by the crystalline silicon substrate 11 and which comprises first conductivity type, e.g. n-type. The vertical power transistor device 10 further includes a body region 24 which is arranged on the drift region 23 and which has a second conductivity type, e.g. p-type, which opposes the first conductivity type, and a source region 25 which has the first conductivity type and which is arranged on the body region 24. The source region 25 extends to the front first surface 12. The vertical power transistor device 10 includes a drain region 26 which has the first conductivity type and which is arranged at the second surface 13 of the substrate 11. The mesas 19 formed between the neighbouring ones of the trenches 16 comprise the drift region 23, body region 24 and source region 25.

The lateral extension 21 is positioned at a depth from the first surface 12 within the trench 16 so that it is laterally aligned with the drift region 23.

The polysilicon of the field plate 14 has the first conductivity type and is more highly doped than the drift region 23. In some embodiments, the doping level of the polysilicon field plate 14 is at least twice as high as the doping level of the substrate 11 forming the drift region 23. In these embodiments, the interfacial silicon nitride layer 15 can act as a diffusion barrier to prevent the diffusion of the dopants of the first conductivity type from the more highly doped polysilicon field plate 14 into the drift region 23. Additionally, the interfacial silicon nitride layer may hinder the formation of crystal defects in the crystalline silicon of the substrate 11 during the formation of the polysilicon field plate 14.

The interfacial silicon nitride layer 15 forms part of the electrical connection between the field plate 14 and the substrate 11 since it is in direct contact with the field plate 14, by way of the lateral extension 21, and is in direct contact with the substrate 11 in particular the drift region 23. In the embodiment illustrated in FIG. 2, the field plate 14 is coupled to the potential of the drift region 23.

The thickness of the silicon nitride layer 15 may be selected such that an electrical connection between the field plate 14 and the substrate 11 can be formed and also such that the interfacial silicon nitride layer 15 can act as a diffusion barrier. In some embodiments, the silicon nitride layer has a thickness of 0.2 nm to 10 nm, or 0.2 nm to 1.5 nm.

In some embodiments, the vertical power transistor device 10 also includes a gate electrode 27 which is arranged in the trench 16. The gate electrode 27 is electrically conductive and is arranged in the upper portion of the trench 16 such that it is electrically insulated from the field plate 14 formed in the lower portion of the trench by an intermediate electrically insulating layer 28. In the upper portion of the trench 16, the electrically insulating material 20 may have a thickness between the sidewalls of the trench 17 and the gate electrode 27 which is suitable for forming the gate insulating layer 29 of the transistor structure.

In some embodiments, the insulating material within the trench 16 comprises multiple sublayers, for example a first sublayer 20 which lines the sidewalls 17 and base 18 of the trench 16 below the lateral extensions 21 of the field plate 14, a second sublayer 28 which is arranged on the field plate 14 and on the lateral extension 21 and a third sublayer 29 which forms the gate insulating layer 29 arranged on the sidewall 17 between the gate electrode 27 and the sidewalls 17.

One or more insulating layers 30 are arranged on the front surface 12 of the substrate 11 which cover the gate electrodes 27. An opening 31 for a contact to the exposed region of the source region 25 and the body region 24 is formed in the electrically insulating layer 30. The opening 31 has a base 32 that is positioned in the source region 25 and body region 24 of the mesa 19. In some embodiments, a contact region 33 is formed at the base of the opening 31 in the substrate 11, in particular in the body region 24. The contact region 33 is more highly doped with the second conductivity type than the body region 24. The opening 31 is lined or filled with conductive material to form a contact 34. The conductive material may comprise tungsten and may comprises a multi-layer structure, for example, TiN, Ti and W.

Figure 3:
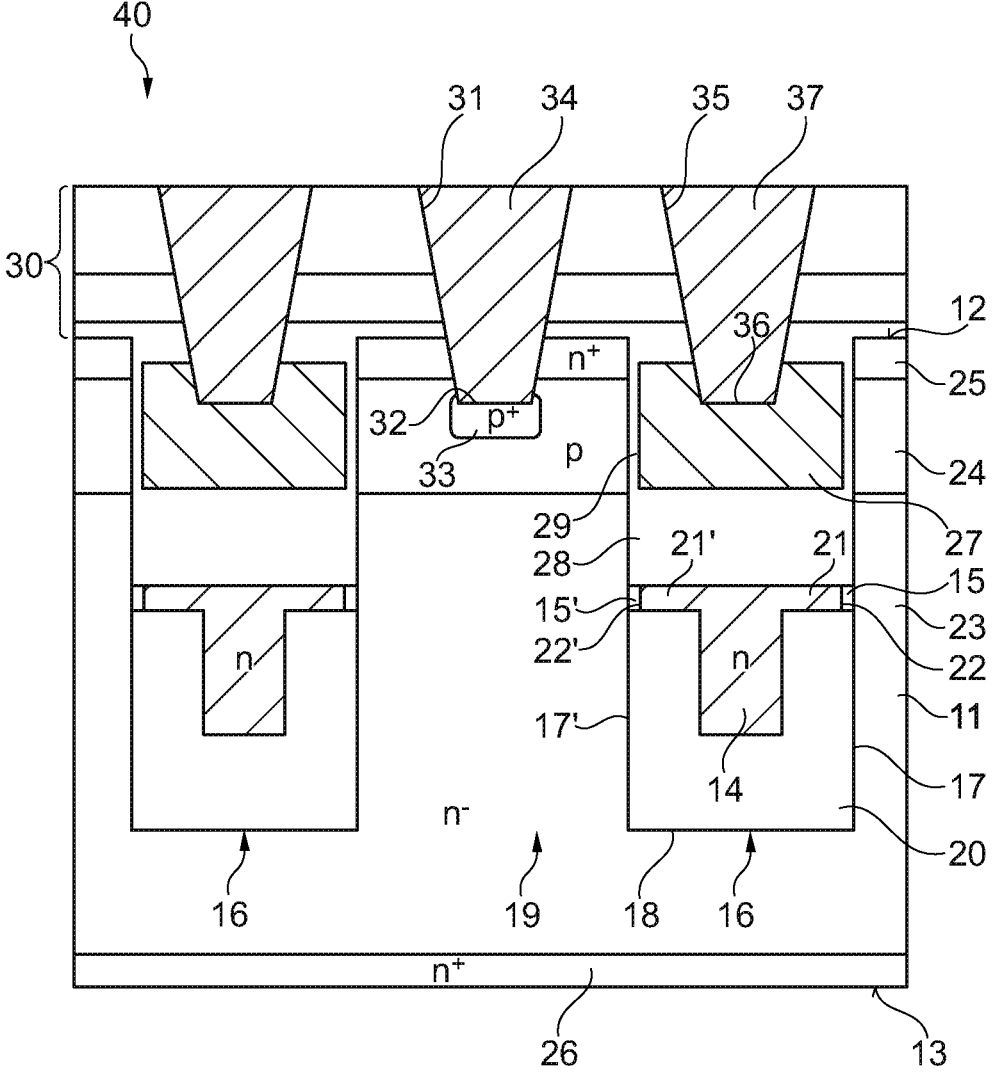
FIG. 3 illustrates a cross-sectional view of a vertical transistor device according to an embodiment.

FIG. 3 illustrates a cross-sectional view of a vertical power transistor device 40 according to another embodiment. In this embodiment, the trenches 16 have a columnar shape which can also be described as a needle shape of specular, rather than having an elongate stripe shape in plan view. The other features of the vertical transistor device 40 are similar to that of the transistor devices 10 described with reference to FIG. 2. The columnar trenches 16 may be arranged in a regular array, for example of rows and columns or in staggered rows. The mesas 19 are formed by the regions of the crystalline substrate that are arranged between the columnar trenches 16.

Each of the columnar trenches 16 includes a field plate 14 which has at least one lateral extension 21. The field plate 14 and the gate electrode 27 also have a columnar form in plan view in contrast to the embodiment illustrated in FIG. 2, where both the field plate 14 and the gate electrode 27 have an elongate stripe-like structure with the longest dimension extending into the plane of the drawing.

In the embodiment illustrated in FIG. 3, the columnar field plate 14 has a lateral extension 21 extending laterally outwardly from the central columnar field plate 14. The field plate can be considered to have a nail shape with the lateral extension 211 forming the nail head. For example, if the field plate 14 and trench 16 are circular in plan view, the lateral extension 21 can be considered to have a circular ring-shape of circular disc-shape in plan view. An interfacial silicon nitride layer 15, 15' arranged between the end faces 22 of the lateral extensions 21, 21' and the sidewalls 17, 17' of the columnar trenches 16 to enable electrical connection between the field plate 14 and the drift region 23 similar to the embodiment illustrated in FIG. 2.

The transistor device further comprises openings 35 through the insulating layer 30 on the first surface 12 which are positioned above the trenches 16. The opening 35 has a base 36 positioned in the gate electrode 27 that is positioned towards the top of the trench 16. The opening 35 comprises conductive material 37 to form a contact to the gate electrode 27.

Figure 4:
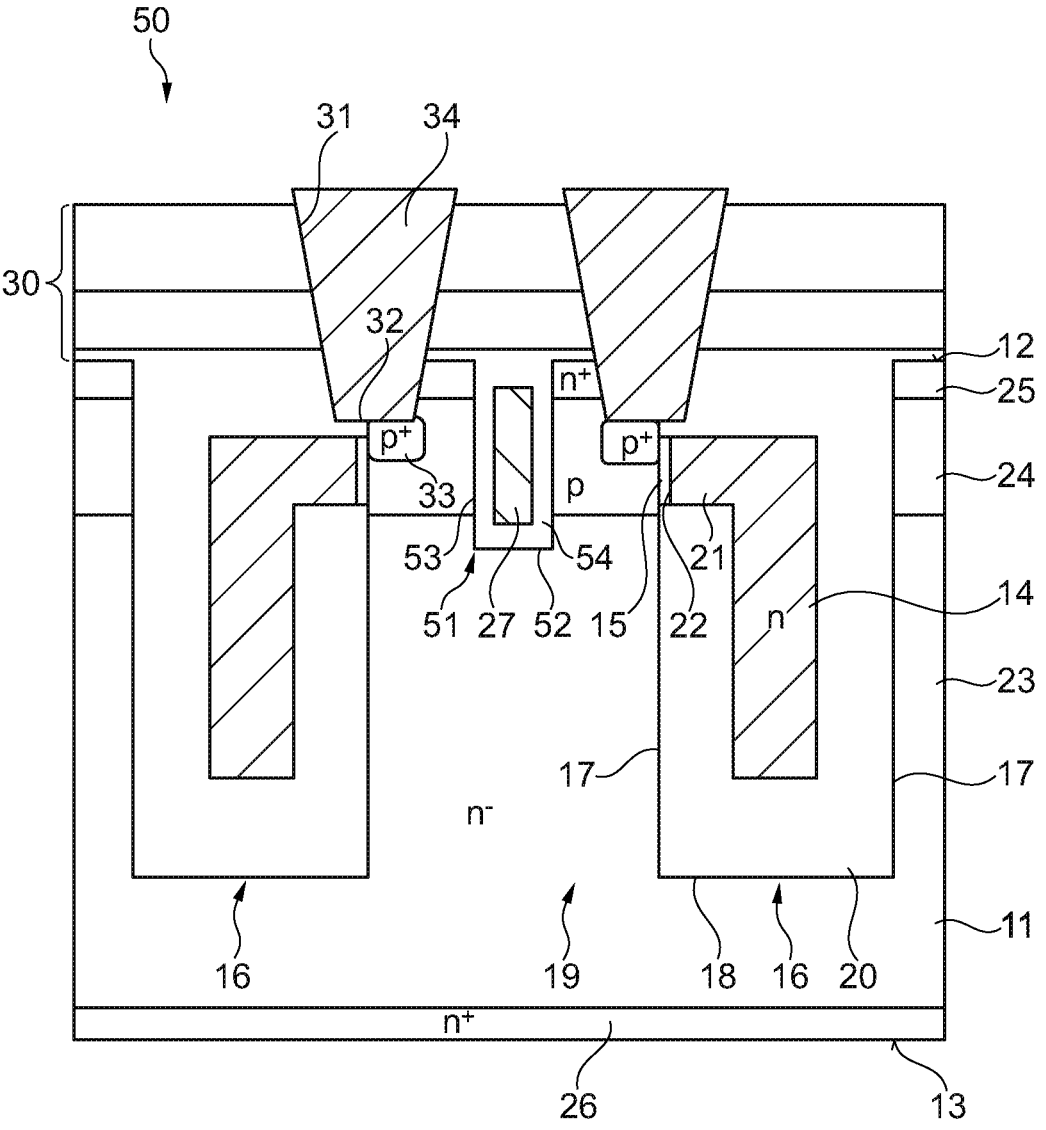
FIG. 4 illustrates a cross-sectional view of a vertical transistor device according to an embodiment.

FIG. 4 illustrates a cross-sectional view of a vertical power transistor device 50 according to an embodiment. The vertical transistor device 50 includes a substrate 11 formed of crystalline silicon and having the first conductivity type which forms the drift region 23, a body region 24 of the second conductivity type arranged on the drift region 23, a source region 25 of the first conductivity type arranged on the body region 24 and a drain region 26 of the first conductivity type arranged at the second surface 13. The vertical power transistor device 50 includes a plurality of columnar trenches 16 which extend into the substrate 11 from the first surface 12 and which have a base positioned within the drift region 23. The columnar trenches 16 may be arranged in a regular array, for example of rows and columns or in staggered rows. The mesas 19 are formed by the regions of the crystalline substrate that are arranged between the columnar trenches 16.

The vertical power transistor device 50 also includes a field plate 14 arranged in the lower portion of the trenches 16 and a gate electrode 27. In this embodiment, the gate electrode 27 is arranged in a separate gate trench 51 which is positioned in the mesa 19 and which is spaced apart from neighbouring ones of the trenches 16 in which the field plate 14 is positioned. The gate electrode 51 may have a stripe-like elongate structure or a grid structure in the top view. The gate electrode 27 may be formed of polysilicon. The gate trench 51 has a base 52 and sidewalls 53 which are lined with an electrically insulating material 54 that electrically insulates the gate electrode 27 from the substate 11. The region of the electrically insulating material arranged between the gate electrode 27 and the sidewall 53 forms the gate insulating layer of the transistor device 50.

In this embodiment, the field plate 14 includes only a single extension 21 which extends laterally parallel to the first surface 12. The lateral extension 21 has a distal end face 22 which is in direct contact with an interfacial silicon nitride layer 15 which is arranged on the sidewall 17 of the trench 16 and which forms a portion of electrical connection between the field plate 14 and the substrate 11. In contrast to the embodiments illustrated in FIGS. 2 and 3, the lateral extension 21 is positioned at a depth from the first surface 12 of the substrate 11 that is laterally aligned with the body region 24. The portion of the sidewall 17 of the trench 16 which is in contact with the interfacial silicon nitride layer 15 is formed by the body region 24. The interfacial silicon nitride layer 15 therefore, forms a part of lateral electrical connection between the field plate 14 and the body region 24. Since the field plate 14 is electrically connected to the body region 24 and, therefore, to source potential. In cross-sectional view, the field plate 14 can be considered to have an inverted L-shape.

The opening 31 through the insulating layer 30 positioned on the front surface 12 of the substrate 11 may be positioned such that it is partly within the columnar trench 16 and partly in the body region 24. The base of the opening 31 is, however, spaced apart from the lateral extension 21 by a portion of the electrically insulating material that covers the upper part of the trench 16. A contact region 33 which is more highly doped with the second conductivity type than the body region 24 may also be formed at the base 32 of the opening 31.

In other non-illustrated embodiments, the vertical transistor device has a separate gate trench 51 and the field plate 14 includes two opposing lateral extensions 21 so that the field plate 14 has a T-shape with the two opposing lateral extensions 21, 21' connected to the body region 24. In other non-illustrated embodiments, the field plate 14 has a single extension 21 as shown in FIG. 4 but is positioned at a greater depth from the first surface 12 such that the single extension 21 is laterally aligned with the drift region and the field plate 14 is electrically connected to the drift region 23 by a single lateral extension 21.

Figure 5:
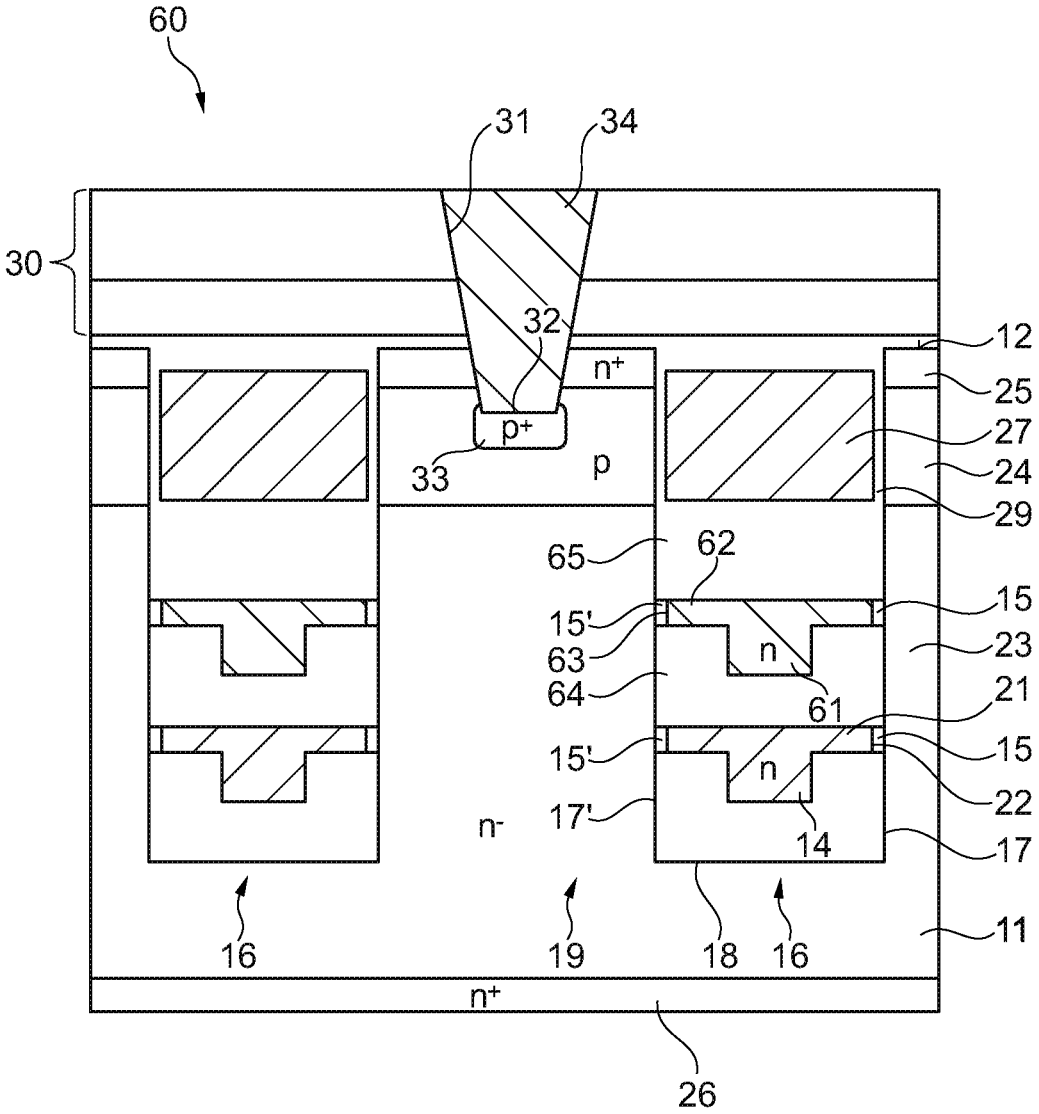
FIG. 5 illustrates a cross-sectional view of a vertical transistor device according to an embodiment.

FIG. 5 illustrates a cross-sectional view of a vertical power transistor device 60 according to another embodiment that has a structure that is similar to the transistor devices 10, 40 described with reference to FIGS. 2 and 3. In this embodiment, the trenches 16 include two field plates 14, 61 which are arranged in a stack within the trench 16. In other non-illustrated embodiments, more than two field plates are arranged in a stack in the trench 16. The trenches 16 may have a strip-like form or be columnar.

The further field plate 61 is arranged above and spaced apart from the field plate 14 arranged towards the bottom of the trench 16 by an intermediate electrically insulating material 64. In this embodiment, the further field plate 61 has a similar structure to the field plate 14 and includes two lateral extensions 62 extending in opposing directions to provide the field plate 61 with a T-shape in cross-section.

The further field plate 61 is arranged below and electrically insulated from the gate electrode 27 arranged in the upper portion of the trench 16 by an intermediate electrically insulting layer 65. Each of the lateral extensions 62 is electrically coupled to the substrate 11 by an interfacial silicon nitride layer 15 arranged between the distal end face 63 of the lateral extension 62 and the crystalline silicon of the substrate 11 which forms the sidewall 17 of the trench 16.

In this embodiment, both field plates 14, 61 are electrically connected to the drift region 23 by the contact formed between the polysilicon lateral extension 21, 62 of the field plate 14, 61, respectively, the silicon nitride interfacial layer 15 and the sidewall 17 of the trench 16 that is formed by the crystalline silicon of the substrate 11. In other embodiments, the field plates 14, 61 may be coupled to difference potentials, for example the upper field plate 61 may be coupled to source potential and the lower field plate 14 to drift potential.

A method of fabricating a vertical transistor device with a field plate in a trench will now be described with reference to FIGS. 6A to 6J. The method may be used to fabricate the vertical transistor device according to one of the embossments described herein including those described with reference to FIGS. 1 to 5.

Figure 6A:
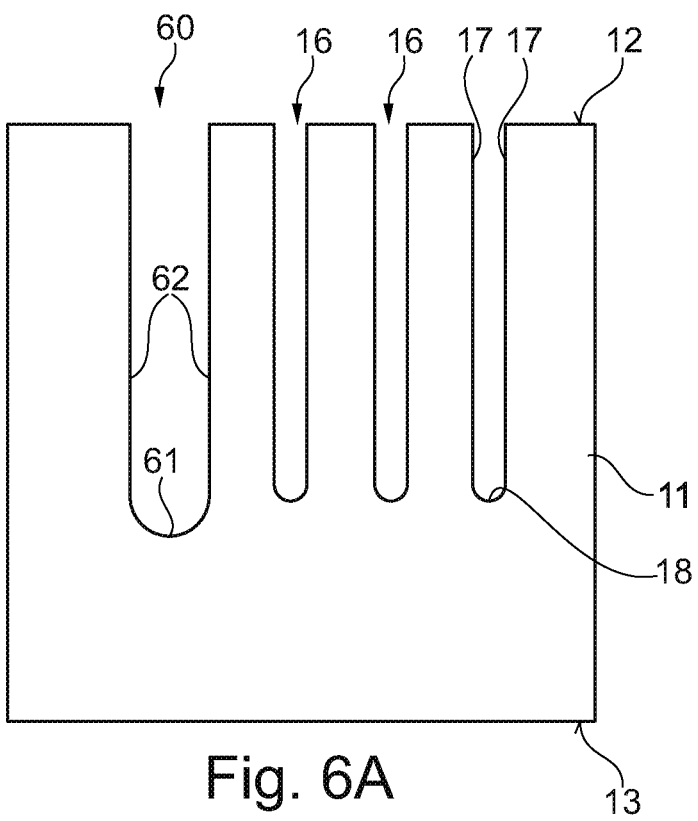
FIGS. 6A to 6J illustrate a method for fabricating a field plate in a trench for a vertical transistor device.

FIG. 6A illustrates a cross-sectional view of a semiconductor substrate 11 formed of crystalline silicon which has a first surface 12 and a second surface 13 opposing the first surface 12. The crystalline silicon substrate 11 has a first conductivity type, e.g. n-type. At least one trench 16 is formed in the first surface 12 of the substrate 11. The trench 16 has a base 18 and sidewalls 17. In the illustrated embodiment, the sidewalls 17 extend substantially perpendicularly to the first surface 12 and the base 18 is rounded. The trenches 16 may have other shapes, for example have a flat base 18 and/or sidewalls 17 that are inclined to the first surface 12. The trenches 16 may have a columnar form or an elongate stripe-like form in top view.

The vertical transistor device typically comprises a large number of trenches 16, of which three can be seen in FIG. 6, each trench 16 being part of one of a large number of active transistor cells in the active area of the transistor device that is used for switching a load current. Also shown in FIG. 6 is an edge trench 60 which has a base 61 and sidewalls 62. The height of the edge trench 60 as determined by the depth of its base 61 from the first surface 12 may be greater than the height of the trenches 16 as determined by depth of the base 18 from the first surface 12. The edge trench 60 may have a greater width than the trenches 16. The edge trench 60 forms part of the edge termination structure of the transistor device.

Figure 6B:
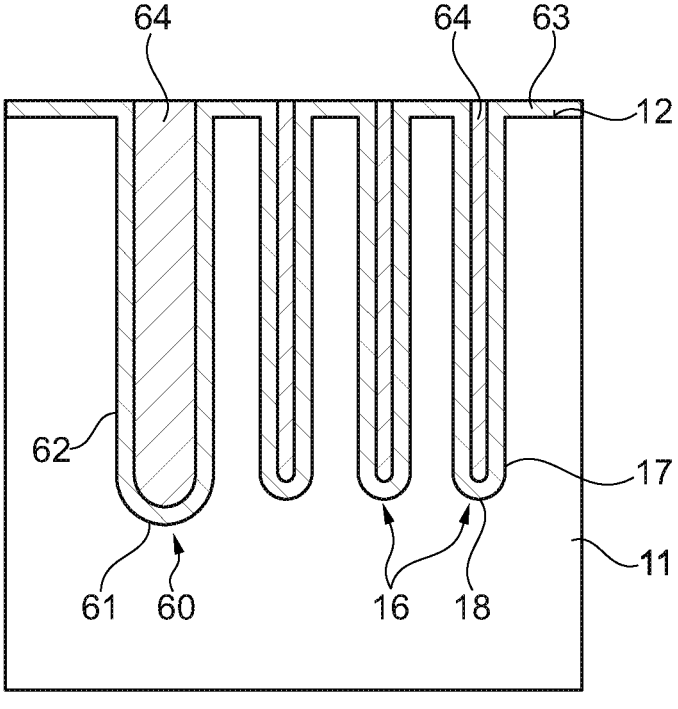

Referring to FIG. 6B, a first insulating layer 63 is formed which lines the sidewalls 17 and base 18 of the trenches 16 and also lines the sidewalls 62 and base 61 of the edge trench 60. The first insulating layer 63 also extends over the first surface 12 in regions between the trenches 16, 60. The electrically insulating layer 63 may be formed by thermal oxidation of the first surface 12 and surfaces of the trenches 16, 60. The first insulating layer 63 lines the trenches 16, 60 such that a gap remains towards the centre of the trench 16, 60 which is then subsequently filled with polysilicon 64. The polysilicon 64 is doped with the first conductivity type, e.g. n-type, and typically has a higher doping level that the substrate 11, for example at least twice as high. After deposition of the polysilicon 64, a planarisation process may be carried out, for example using chemical mechanical polishing.

Figure 6C:
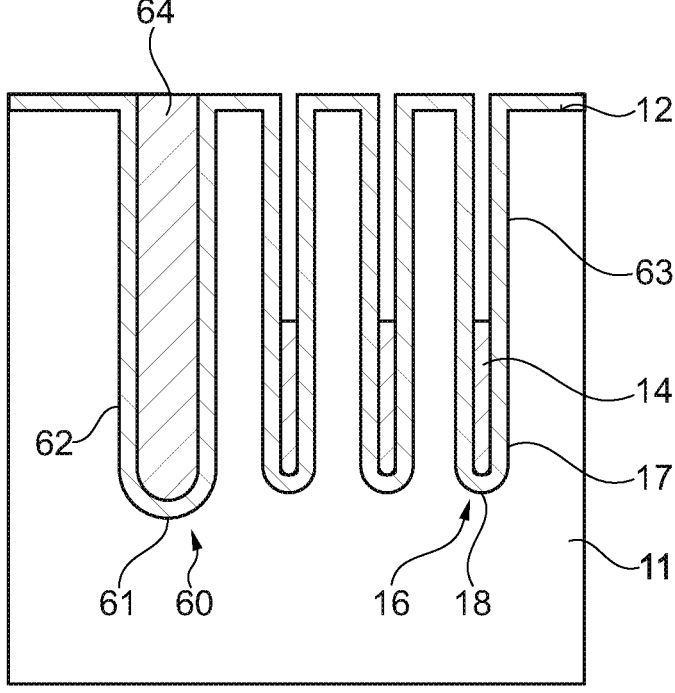

Referring to FIG. 6C, the polysilicon 64 is removed from an upper portion of the trenches 16 leaving polysilicon at the base of the trenches 16 which forms the field plate 14 having a certain height. The polysilicon 64 in the edge trench 60 is not removed and extends to the planarised surface.

Figure 6D:
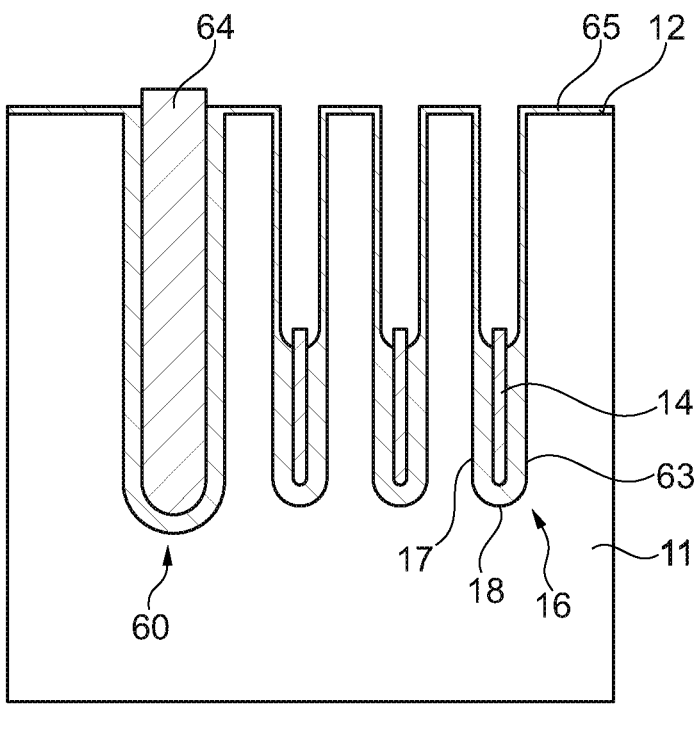

Referring to FIG. 6D, an outer portion of the first insulating layer 63 that is arranged on the sidewalls 17 of the trenches 16 is removed to form a thinned first insulating layer 65 lining the trench 16. An outer portion of the insulating material 63 arranged on the first surface 12 is removed to form a thinned first insulating layer 65. The thickness of the first insulating layer 63 on the first surface 12 is also reduced. A portion of the first insulating layer 63 is removed from regions adjacent to the field plate 14 such that the polysilicon of the field plate 14 protrudes above the remainder of the first insulating layer 63. Similarly, the polysilicon 64 in the edge trench 60 also protrudes above the remaining thinned layer 65 of the first insulating material 63 which is arranged on the first surface 12. A wet etching process may be used to remove a portion of and reduce the thickness of the first insulating layer 63 to produce the thinned first electrically insulating layer 65.

Figure 6E:
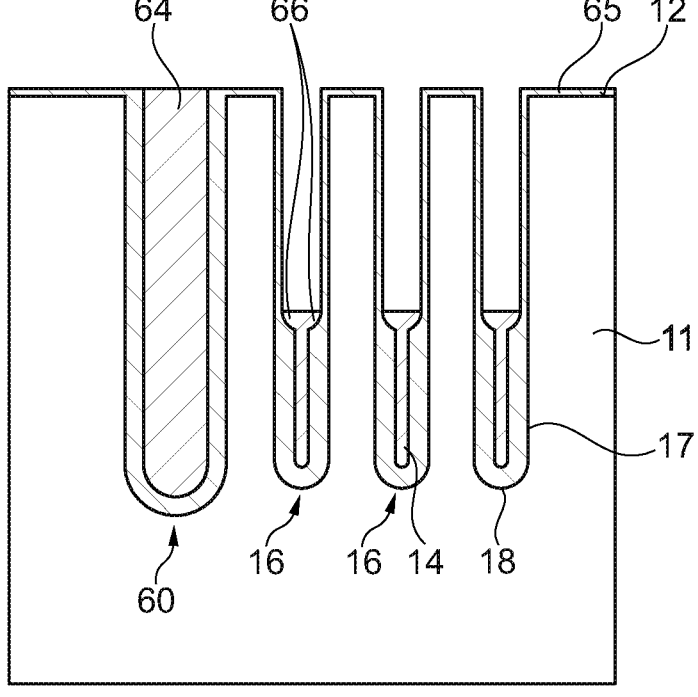

Referring to FIG. 6E, polysilicon 66 is formed in the trenches 16 in regions adjacent the exposed portion of the field plate 14 and adjacent the thinned electrically insulating layer 65 such that an upper portion of the field plate 14 is laterally larger than the lower portion of the field plate 14.

Figures 6F, 6G:
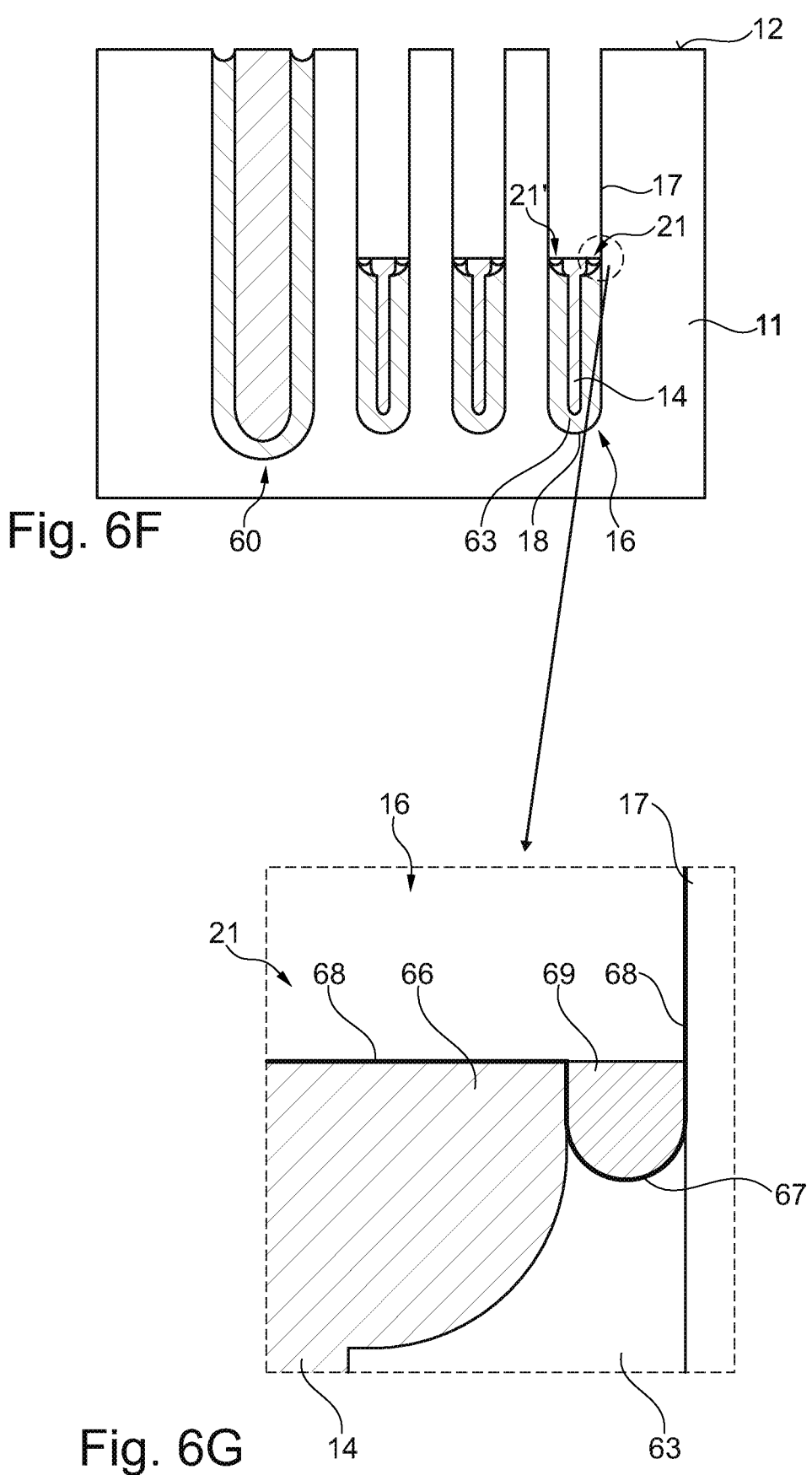

Referring to FIG. 6F, the thinned first insulating 65 is removed from the sidewalls 17 of the upper portion of the trenches 16 for example, by wet etching. As can be seen more easily in the enlarged view of FIG. 6G, a portion of the first insulating layer 63 which is positioned between the enlarged upper end 66 of the field plate 14 and the sidewall 17 is removed. This results in the formation of an indentation 67 in the upper surface of the first insulating layer 63 remaining in the trench 16. The indentation 67 is positioned laterally adjacent to the field plate 14 and the side wall 17 such that a portion of the distal end of the enlarged field plate 14 and the portion of the sidewall 17 positioned laterally adjacent to the upper surface of the enlarged portion field plate 14 are exposed from the first insulation layer 63.

A silicon nitride layer 68 is then formed in the trench 16. The silicon nitride layer 68 extends over the exposed surfaces of the sidewalls 17 of the trench 16, the top surface and side surfaces of the enlarged portion field plate 14. In some embodiments, the silicon nitride layer 68 is formed by nitridation of the exposed silicon of the sidewalls 17 of the trench and the polysilicon of the exposed portions of the field plate 14.

In some embodiments, the silicon nitride layer 68 may also be formed on the upper surface of the first electrically insulating material 63 remaining in the trench 16 and over the surface of the indentation 67 in the first electrically insulating layer 63. In some embodiments, a silicon oxynitride layer rather than silicon nitride is formed on the upper surface of the first electrically insulating material 63 remaining in the trench 16 and over the surface of the indentation 67 in the first electrically insulating layer 63.

Polysilicon 69 is then deposited into the trench 16 which fills the indentation 67 in the electrically insulating layer 63 such that a structure is formed between the polysilicon field plate 14 and the substrate 11 which provides a lateral extension 21 for the field plate 14. In this embodiment, two opposing lateral extensions 21, 21' are formed.

The lateral extensions 21, 21' each have a structure including the enlarged head 66 of the field plate 14, a silicon nitride layer 68 positioned directly on the polysilicon of the enlarged field plate 14, the polysilicon 69 filling the indentation 67, the silicon nitride layer 68 positioned directly the polysilicon 69 and on the sidewall 17 formed by the crystalline silicon of the substrate 11. The silicon nitride layer 68 forms an interfacial layer between the substrate 11 and the polysilicon 69 as well as an interfacial layer between the polysilicon portions 66, 69 of the lateral extension 21, 21'. An electrical connection can be made between the field plate 14 and the semiconductor substrate 14 by means of this structure of the lateral extension 21, 21'. The silicon nitride layer may be thin, for example have thickness of between 0.2 nm and 10 nm such that an electrical connection can be formed across the interfacial silicon nitride layers between the field plate 14 and the substrate 11.

Figure 6H:
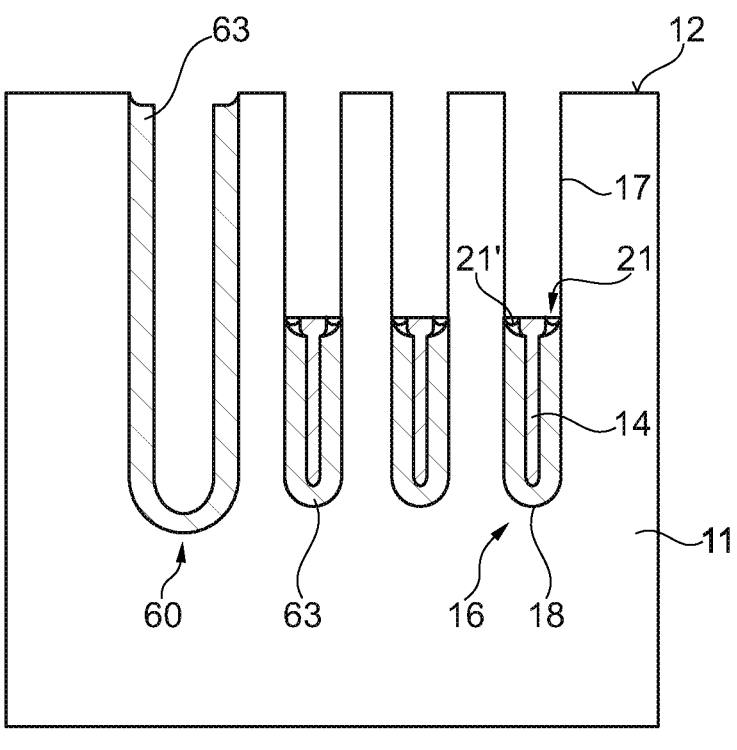
Figure 6I:
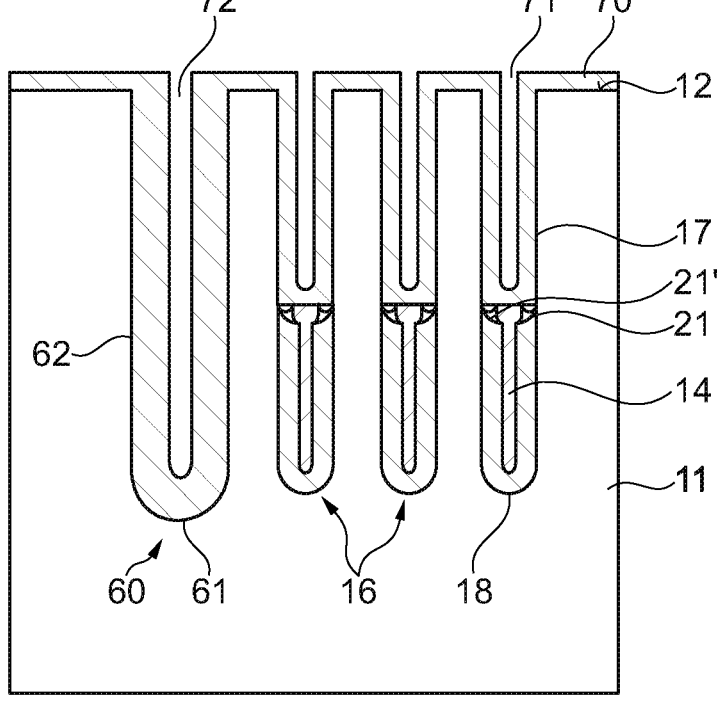

Referring to FIG. 6H, the conductive material 64 is then removed entirely from the edge trench 60 and as shown in FIG. 6I a second electrically insulating layer 70 is applied which is positioned on the first surface 12 and which lines the sidewalls 17 in the upper portion of the trenches 16 and which extends over the field plate 14 with its lateral extensions. The second insulating layer 70 is also formed in the edge trench 60, increasing the thickness of the insulating layer within the edge trench 60.

The second insulating layer 70 may be formed by thermal oxidation or deposition, for example using a TEOS (Tera Ethyl Ortho Silicate) process. In some embodiments, the second insulating layer 70 is formed by a multiple step process in which a first sublayer is formed by thermal oxidation and a second sublayer is formed on the first sublayer, e.g. by deposition using a TEOS process. The second insulating layer 70 surrounds a gap 71 formed in the upper portion of the trenches 16 and a gap 72 in the edge trench 60.

Figure 6J:
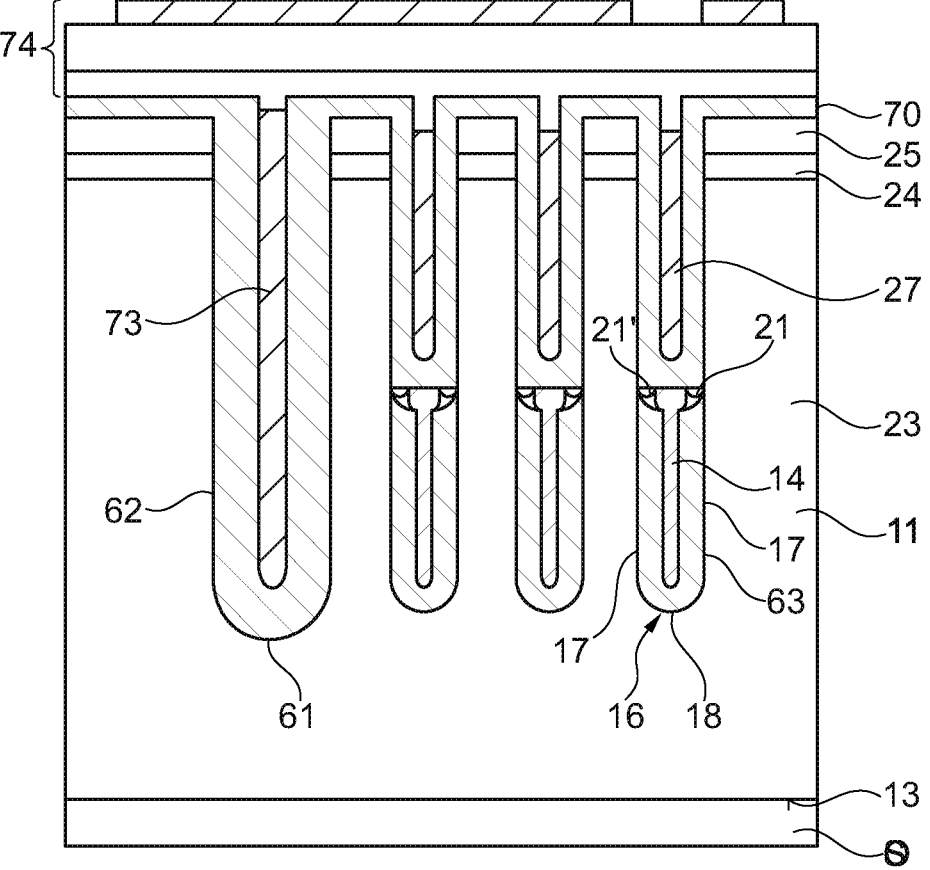

Referring to FIG. 6J, the method then continues by inserting polysilicon 73 into the gaps 71, 72 in order to form a gate electrode 27 in the upper portion of the trenches 16 and a field plate 73 in the edge trench 60.

The method then may then continue by forming a body region 24 of the second conductivity type that opposes the first conductivity type of the crystalline silicon substrate 11 by implanting dopants of the second conductivity type into the first surface 12 and by forming a source region 25 of the first conductivity type on the body region 24, for example, by implanting dopants of the first conductivity type. The drain region 26 that comprises the first conductivity type may already be formed at the second surface 13 of the substrate 11 which opposes the first surface 12. In some embodiments, the drain region 26 is formed by implantation. A metallization structure 74 may then be formed on the first surface 12 and second surface 13.

In other embodiments, one or two lateral extensions 21, 21' of the field plate 14 may be fabricated by removing all of the first electrically insulating layer 63 form the upper portion of the trench 16 to expose the sidewalls 17 of the trench 16 above the field plate 14. The silicon nitride layer 68 is formed and covers the sidewalls 17 and upper surface of the field plate 14 and optionally may also be formed on upper surface of the first insulating layer 63 remaining in the trench 16 adjacent the field plate 14 and then a polysilicon layer is deposited onto the upper surface of the field plate 14 and first insulating layer 63 remaining in the trench 16 adjacent the field plate 14 which extends between the sidewalls 17 of the trench, thus creating the opposing lateral extensions 21, 21' with the silicon nitride layer 68 arranged between the end face 22 of the extension 21 and the sidewall 17 of the trench 17 as well as between the polysilicon layer of the lateral extensions and the top of the field plate 14.

An electrical connection structure between polysilicon and crystalline silicon including an interfacial silicon nitride layer may also be used in other positions within a transistor structure. Other types of semiconductor devices may also benefit from the use of an interfacial silicon nitride layer between the polysilicon and the crystalline silicon. One example of such a semiconductor device, in which an arrangement of an interfacial silicon nitride layer between regions formed of polysilicon and crystalline silicon may be included, is a diode.

Figure 7A:
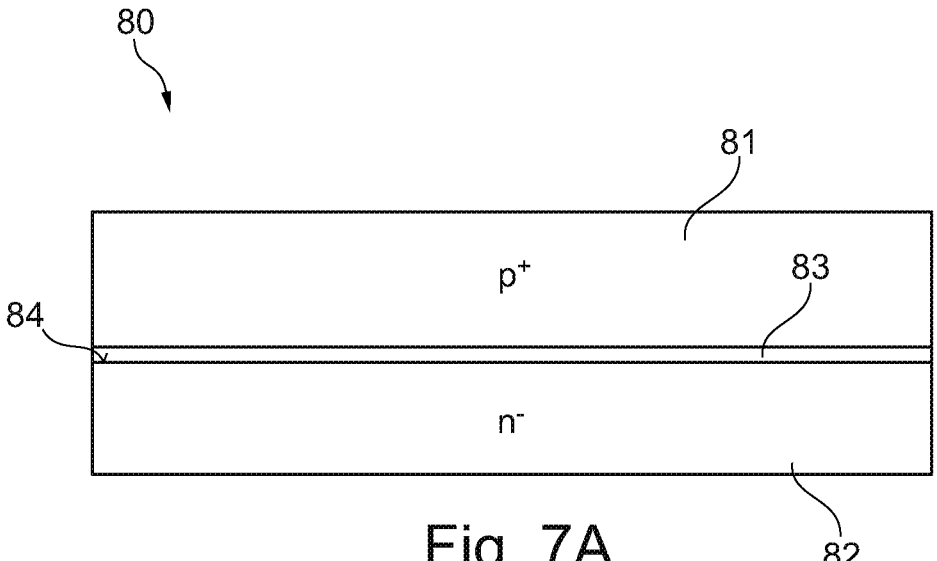
FIG. 7A illustrates a diode according to an embodiment.

FIG. 7A illustrates a diode 80 according to an embodiment which comprises a polysilicon layer 81 having a first conductivity type and a crystalline silicon layer 82 having a second conductivity type opposing the first conductivity type. In embodiments in which the polysilicon is p-type, the crystalline silicon layer 82 may be n-type. In some embodiments, the polysilicon layer 81 is heavily doped, for example p+ and the crystalline silicon substrate 82 is lightly doped, for example n−.

The diode 80 includes an interfacial silicon nitride layer 83 which is arranged between the polysilicon layer 81 and the crystalline silicon layer 82. The interfacial silicon nitride layer 83 is in direct contact with the polysilicon layer 81 and in direct contact with the crystalline silicon layer 82. The interfacial silicon nitride layer 83 may act as a diffusion barrier to prevent the diffusion of the dopants of the second conductivity type from the highly doped polysilicon layer 81 into the crystalline silicon layer 82. This may be used to assist in providing a steep or sharp pn junction which provides better blocking capability for the diode. The thickness of the interfacial silicon nitride layer 83 may be selected so as to prevent diffusion and may have a thickness of 0.2 nm to 10.0 nm, or 0.2 nm to 5 nm, or 0.2 nm to 2 nm, or 0.4 nm to 1.8 nm.

In some embodiments, the crystalline silicon layer 82 is formed of a crystalline silicon substrate, such as a monocrystalline substrate. In other embodiments, the crystalline silicon layer 82 may be formed of an epitaxial crystalline silicon layer formed on a base substrate.

In some embodiments, the crystalline silicon layer 82 is provided in the form of a substrate having a first surface 84. For example, the crystalline silicon layer 82 may be provided by a monocrystalline silicon wafer or monocrystalline silicon die or may be provided by an epitaxial silicon layer formed on a base substrate which may be a monocrystalline (single crystal) silicon wafer or monocrystalline silicon die.

The diode 80 may be fabricated by depositing silicon nitride layer 83 on the first surface 84 of the crystalline substrate 82 and by depositing the polysilicon layer 81 onto the silicon nitride layer 83. In this embodiment, the pn junction formed between the polysilicon layer 81 and the crystalline silicon 82 extends substantially parallel to the first surface 84. This type of arrangement may be referred to as a lateral diode.

Figure 7B:
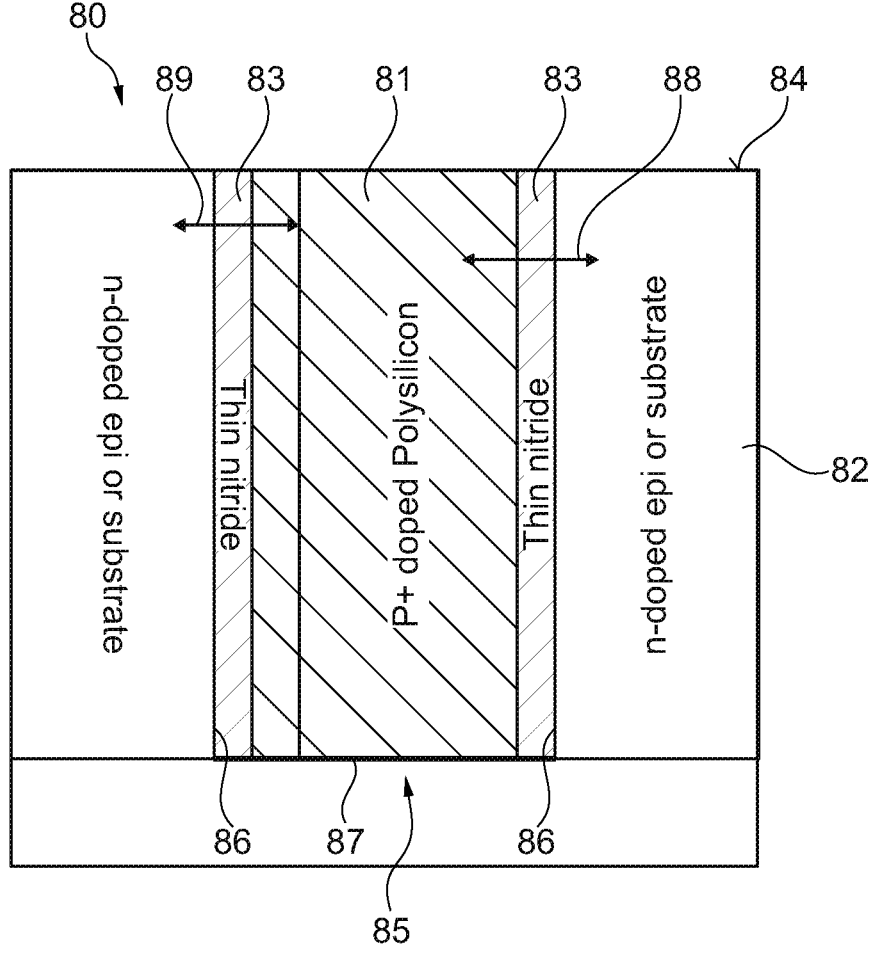
FIG. 7B illustrates a diode according to an embodiment.

FIG. 7B illustrates a diode 80 according to another embodiment. In this embodiment, the crystalline silicon layer 82 is formed from a crystalline silicon substrate having a first surface 84. The crystalline silicon substrate 82 may be formed of monocrystalline silicon wafer or semiconductor die or may be formed of epitaxially deposited silicon.

A trench 85 is formed in the first surface 84 which extends int the substrate 82 from the first surface 84 and which has sidewalls 86 and a base 87. The sidewalls 86 of the trench 85 are formed from material of the crystalline silicon substrate 82. The trench 85 may have an elongate stripe-like structure with its longest length extending into the plane of the drawing or may have a columnar form. The sidewalls 86 of the trench 85 are lined with a silicon nitride layer 83 which is in direct contact with the crystalline silicon material 82 forming the side walls 86. A polysilicon layer 81 is arranged on the silicon nitride layer 83 arranged on the sidewalls 86 of the trench 85. In some embodiments, the trench 85 is filled with polysilicon 81.

In this embodiment, two diodes are formed since two pn junctions 87, 88 are formed between the polysilicon layer 81 that is heavily doped with the first conductivity type, for example p+, and the substrate 82 that is formed of the opposing first conductivity type, for example n−.

In this embodiment, the two pn junctions 87, 88 that are formed between the polysilicon material 81 arranged in the trench 85 and the crystalline silicon material forming the sidewalls 86 extend substantially perpendicular to the first surface 84. The diode 80 may be referred to as a vertical diode.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A power transistor device, comprising:
a substrate formed of crystalline silicon and having a first surface and a second surface opposing the first surface;
a field plate formed of polysilicon and that is electrically connected with the substrate; and
an interfacial silicon nitride layer that is arranged between the polysilicon of the field plate and the crystalline silicon of the substrate,
wherein the interfacial silicon nitride layer forms part of the electrical connection between the field plate and the substrate.

2. The power transistor device of claim 1, wherein the interfacial silicon nitride layer is in direct contact with the polysilicon and the crystalline silicon.

3. The power transistor device of claim 1, further comprising:
a drift region;
a source region;
a body region; and
a drain region,
wherein the semiconductor substrate has a first conductivity type and forms the drift region,
wherein the body region has a second conductivity type and is arranged on the drift region, the second conductivity type opposing the first conductivity type,
wherein the source region has the first conductivity type, is arranged on the body region, and extends to the first surface,
wherein the drain region has the first conductivity type and is arranged at the second surface of the substrate, and
wherein the field plate is arranged in a trench extending into the substrate from the first surface.

4. The power transistor device of claim 3, wherein the trench has side walls and a base, and is lined with insulating material, wherein the field plate has at least one lateral extension that extends through the insulating material and is in contact with the interfacial silicon nitride layer that is arranged on the side wall of the trench.

5. The power transistor device of claim 4, wherein the interfacial silicon nitride layer is arranged between the lateral extension of the field plate and the drift region.

6. The power transistor device of claim 4, wherein the interfacial silicon nitride layer is arranged between the lateral extension of the field plate and the body region.

7. The power transistor device of claim 3, wherein the trench further comprises a gate electrode that is arranged in the trench above and electrically insulated from the field plate.

8. The power transistor device of claim 3, further comprising a further field plate arranged in the trench above and spaced apart from the field plate.

9. The power transistor device of claim 3, wherein the trench is a columnar trench or an elongate trench.

10. The power transistor device of claim 1, wherein the polysilicon has a first conductivity type and a doping level that is at least twice a doping level of the substrate, and wherein the interfacial silicon nitride layer is configured as a diffusion barrier.

11. The power transistor device of claim 1, wherein the interfacial silicon nitride layer has a thickness of 0.2 nm to 10 nm.

12. A method of fabricating a transistor device, the method comprising:
forming a trench in a first surface of a substrate formed of crystalline silicon, the trench having a base and side walls;
lining the trench with a first insulating layer;
filling the trench with polysilicon;
removing the polysilicon from an upper portion of the trench to form a field plate having an upper portion that is exposed from the first insulating layer;
removing the first insulating layer from the side walls in the upper portion of the trench while leaving the first insulating layer in the lower portion of the trench;
forming a silicon nitride layer on the side walls of the trench and on the upper portion of the field plate; and
forming a polysilicon layer on the silicon nitride layer and forming a lateral extension of a field plate that extends towards the side wall of the trench, wherein the silicon nitride forms an interfacial layer between the lateral extension and the side wall of the trench.

13. The method of claim 12, wherein the removing the first insulating layer comprises:
removing an outer portion of the first insulating layer from the upper portion of the trench to form a thinned first insulating layer on the side walls in the upper portion of the trench and exposing the upper region of the field plate from the first insulating layer;
forming the polysilicon layer on the exposed upper region of the field plate such that the polysilicon layer extends towards the thinned insulating layer on the side wall of the trench;
removing the thinned first insulating layer from the side walls in the upper portion of the trench to expose the side walls and removing an upper portion of the first insulating layer from between the polysilicon layer and the side walls of the trench and forming an indentation in an upper surface of the first insulating layer;
forming the silicon nitride layer on the side walls of the trench and on the polysilicon layer; and
filling the indentation with polysilicon to form the lateral extension of the field plate.

14. The method of claim 12, further comprising:
forming a second insulating layer on the side walls in the upper portion of the trench and on the field plate and the lateral extension, the second insulating layer surrounding a gap; and
inserting conductive material into the gap to form a gate electrode or a further field plate.

15. The method of claim 14, further comprising:
forming a body region of a second conductivity type that opposes a first conductivity type of the crystalline silicon substrate; and
forming a source region of the first conductivity type on the body region, wherein a drain region that comprises the first conductivity type is arranged at a second surface of the substrate that opposes the first surface.

16. A power transistor device, comprising:
a substrate formed of crystalline silicon and having a first surface and a second surface opposing the first surface;
a field plate formed of polysilicon arranged in a trench extending into the substrate from the first surface, wherein the trench is at least partially lined with insulating material; and
an interfacial silicon nitride layer partially arranged on one or more side walls of the trench, wherein the field plate has at least one lateral extension that extends through the insulating material and is in contact with the interfacial silicon nitride layer, wherein the interfacial silicon nitride layer is arranged between the at least one lateral extension of the field plate and a drift region of the substrate.

17. The power transistor device of claim 16, further comprising:

a body region;

a source region; and a drain region, wherein the semiconductor substrate has a first conductivity type and forms the drift region, wherein the body region has a second conductivity type and is arranged on the drift region, the second conductivity type opposing the first conductivity type, wherein the source region has the first conductivity type, is arranged on the body region, and extends to the first surface, and wherein the drain region has the first conductivity type and is arranged at the second surface of the substrate.

18. The power transistor device of claim 16, further comprising a further field plate arranged in the trench above and spaced apart from the field plate.

19. The power transistor device of claim 16, wherein the polysilicon has a first conductivity type and a doping level that is at least twice a doping level of the substrate, and wherein the interfacial silicon nitride layer is configured as a diffusion barrier.

20. The power transistor device of claim 16, wherein the interfacial silicon nitride layer has a thickness of 0.2 nm to 10 nm.

* * * * *